United States Patent
Lai (10) Patent No.: US 12,066,486 B2
(45) Date of Patent: Aug. 20, 2024

(54) SEMICONDUCTOR WAFER AND MULTI-CHIP PARALLEL TESTING METHOD

(71) Applicant: Winbond Electronics Corp., Taichung (TW)

(72) Inventor: Chih-Chiang Lai, Taichung (TW)

(73) Assignee: Winbond Electronics Corp., Taichung (TW)

( * ) Notice: Subject to any disclaimer, the term of this patent is extended or adjusted under 35 U.S.C. 154(b) by 72 days.

(21) Appl. No.: 17/736,068

(22) Filed: May 3, 2022

(65) Prior Publication Data

US 2022/0357392 A1    Nov. 10, 2022

(30) Foreign Application Priority Data

May 7, 2021   (TW) ................................. 110116476

(51) Int. Cl.
*G01R 31/28*   (2006.01)
(52) U.S. Cl.
CPC ..... *G01R 31/2884* (2013.01); *G01R 31/2886* (2013.01)
(58) Field of Classification Search
CPC ............ G01R 31/2884; G01R 31/2886; G01R 31/31723; G01R 31/318513
See application file for complete search history.

(56) References Cited

U.S. PATENT DOCUMENTS

| | | | | |
|---|---|---|---|---|
| 7,350,108 B1 * | 3/2008 | Dean | .............. | G01R 31/318505 714/724 |
| 2003/0005375 A1 * | 1/2003 | Krech, Jr. | ........ | G01R 31/31907 714/724 |
| 2005/0234674 A1 | 10/2005 | Bundy et al. | | |
| 2006/0107160 A1 * | 5/2006 | Ricchetti | ................ | G11C 29/56 714/742 |
| 2012/0239339 A1 * | 9/2012 | Kaneko | .............. | G01R 31/3025 702/122 |
| 2014/0195870 A1 * | 7/2014 | Ma | ................... | G01R 31/31932 714/735 |
| 2016/0245864 A1 * | 8/2016 | Mydill | ............. | G01R 31/31908 |
| 2019/0378590 A1 * | 12/2019 | Joo | ................ | G01R 31/318314 |

FOREIGN PATENT DOCUMENTS

| | | |
|---|---|---|
| CN | 105378494 | 3/2016 |
| CN | 108919006 | 11/2018 |
| CN | 110596567 | 12/2019 |
| TW | 202032144 | 9/2020 |

OTHER PUBLICATIONS

"Office Action of Taiwan Counterpart Application", issued on Feb. 25, 2022, p. 1-p. 5.

* cited by examiner

*Primary Examiner* — Eman A Alkafawi
*Assistant Examiner* — Suresh K Rajaputra
(74) *Attorney, Agent, or Firm* — JCIPRNET (57) ABSTRACT

A semiconductor wafer and a multi-chip parallel testing method are provided. The semiconductor wafer includes a plurality of chips, a plurality of test pads, and a test control circuit. The test pads receive a plurality of test signals from a test fixture. The test control circuit is electrically connected to the chips and the test pads, selects at least one selected test signal from the test signals, generates a plurality of broadcast test signals according to the at least one selected test signal, and provides the broadcast test signals to the chips in parallel.

19 Claims, 8 Drawing Sheets

SEMICONDUCTOR WAFER AND MULTI-CHIP PARALLEL TESTING METHOD

CROSS-REFERENCE TO RELATED APPLICATION

This application claims the priority benefit of Taiwan application serial no. 110116476, filed on May 7, 2021. The entirety of the above-mentioned patent application is hereby incorporated by reference herein and made a part of this specification.

BACKGROUND

Technical Field

The disclosure relates to wafer testing, and in particular, relates to a semiconductor wafer and a chip testing method suitable for parallel testing of a plurality of chips.

Description of Related Art

Before an integrated circuit chip is packaged, a chip probing (CP) testing procedure is required to be performed on each chip in the wafer to filter out defective chips, so as to reduce manufacturing costs. In the CP testing procedure, the probe of the test fixture (e.g., probe card) contacts the test pad (e.g., solder pad or bump) on the wafer, and in this way, the test signal is transferred onto the chip through the probe to test the electrical function of the chip. With the advancement of semiconductor manufacturing processes, the number of chips per wafer has increased, which has led to an increase in time and costs required for CP testing of each wafer. At present, some test methods have been proposed to lower testing costs, such as the method of expanding test parallel numbers to reduce testing time. The basic concept of the method of expanding test parallel numbers is to provide the same test signal to multiple chips on the wafer to perform testing to multiple chips at the same time.

Figure 1:
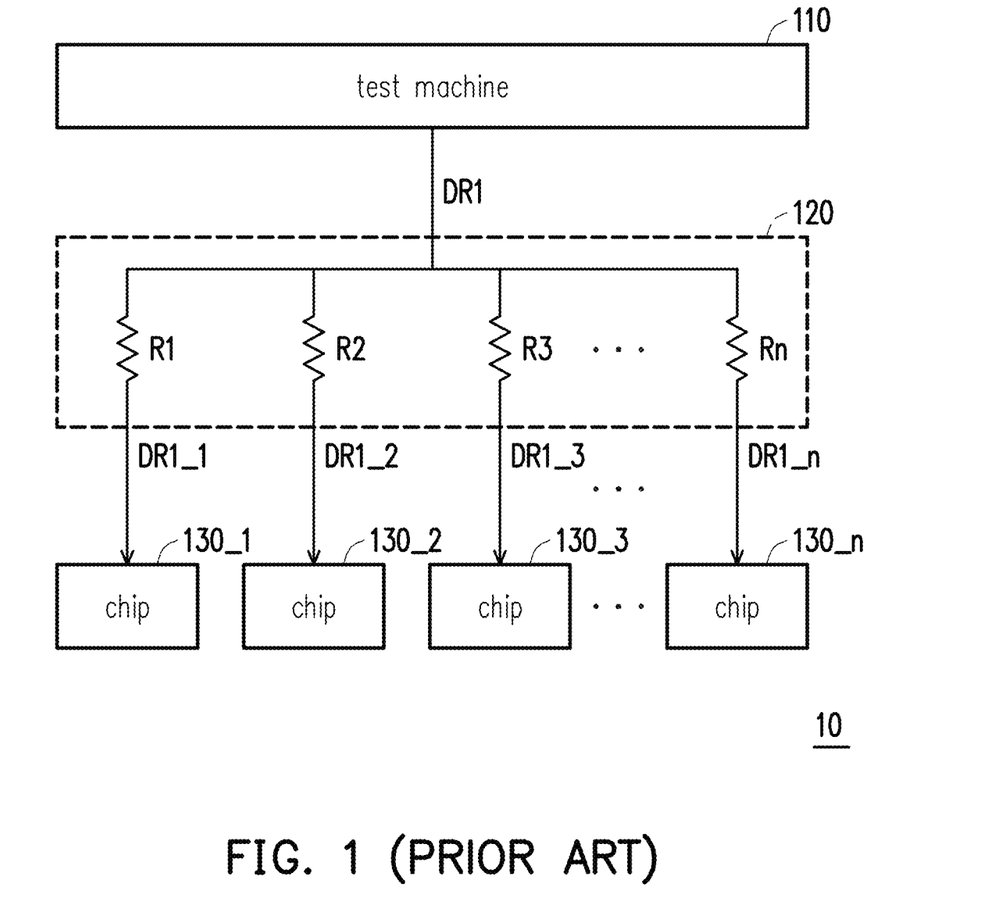
FIG. 1 is a schematic diagram illustrating a conventional chip testing system.

FIG. 1 is a schematic diagram illustrating a conventional chip testing system. A conventional test system 10 includes a test machine 110 and a test fixture 120, and the test parallel number is expanded through the improved test fixture 120. To be specific, the driving signal sent by the test machine 110 is limited, but by designing a signal sharing circuit on the test fixture 120, a single driving test signal DR1 may be expanded to n test signals DR1_1 to DR1_n to be provided to a plurality of chips 130_1 to 130_n. The n test signals DR1_1 to DR1_n are then provided to the chips 130_1 to 130_n through the probe of the test fixture 120.

Nevertheless, the method of expanding a single driving test signal DR1 to multiple test signals DR1_1 to DR1_n through the test fixture 120, signal integrity is required to be sacrificed. As the number of test signals DR1_1 to DR1_n increases, the frequency of test signals DR1_1 to DR1_n may drop, and the rising/falling time may increase, the test speed may thereby be delayed. Further, if the test signal input end of one of the chips 130_1 to 130_n is connected to a short-circuit path or a leakage current path, other test signals may be interfered, the test results of other chips may be affected, and the problem of overkilling may occur. For instance, when one of the chips 130_1 to 130_n is an ugly die located at the edge of the wafer, one of the test signals DR1_1 to DR1_n may be short-circuited to a reference voltage or may be coupled to a leakage current path, and other test signals may thus be interfered. In order to reduce the interference between the test signals, the signal sharing circuit of the conventional test fixture 120 is provided with a plurality of isolation resistors R1 to Rn. Nevertheless, if the resistance values of the isolation resistors R1 to Rn are designed to be excessively small, poor anti-interference ability may be provided. If the resistance values of the isolation resistors R1 to Rn are designed to be excessively large, the signal frequency of the test signals DR1_1 to DR1_n may be reduced, and the test speed may become slower. Therefore, complexity and costs of such test fixture are high.

SUMMARY

Accordingly, the disclosure provides a semiconductor wafer and a chip testing method capable of improving testing accuracy and lowering testing costs.

The disclosure provides a semiconductor wafer including a plurality of chips, a plurality of test pads, and a test control circuit. The test pads receive a plurality of test signals from a test fixture. The test control circuit is electrically connected to the chips and the test pads, selects at least one selected test signal from the test signals, generates a plurality of broadcast test signals according to the selected test signal, and provides the broadcast test signals to the chips in parallel.

The disclosure further provides a multi-chip parallel testing method, and the method includes the following steps. A plurality of test signals are received from a test fixture by a plurality of test pads. At least one selected test signal is selected from the test signals by a test control circuit formed on the semiconductor wafer. A plurality of broadcast test signals are generated according to the selected test signal, and the broadcast test signals are provided to a plurality of chips in parallel by the test control circuit.

To sum up, in the embodiments of the disclosure, the test control circuit formed on the semiconductor wafer may select the selected test signal which is not interfered after receiving the multiple test signals generated by the test machine and generates the broadcast test signals configured to be distributed to the chips in parallel according to the selected test signal. In this way, the chips on the semiconductor wafer may be tested in parallel according to the received broadcast test signals, testing efficiency is thereby improved, and the probability of overkilling may be reduced.

To make the aforementioned more comprehensible, several embodiments accompanied with drawings are described in detail as follows.

DESCRIPTION OF THE EMBODIMENTS

Figure 2:
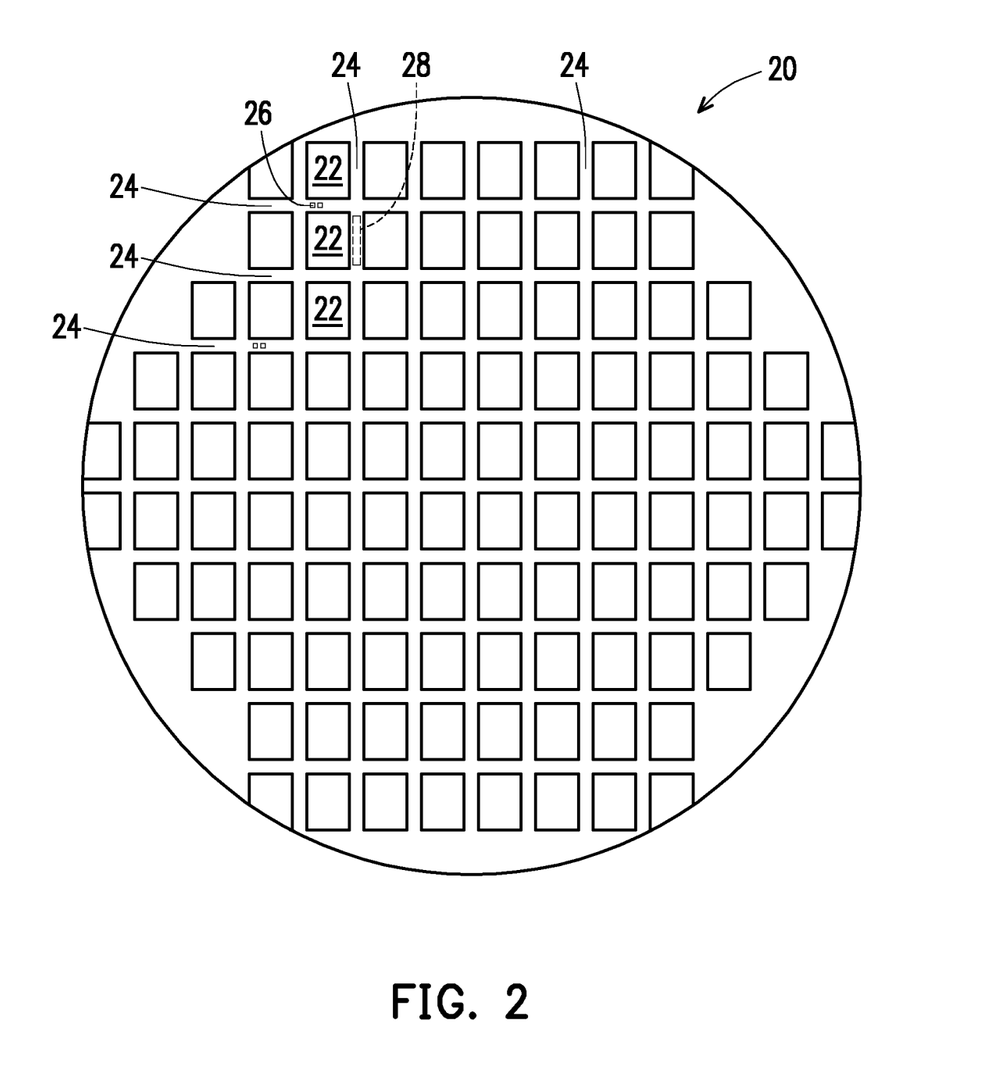
FIG. 2 is a schematic top view of a semiconductor wafer according to an embodiment of the disclosure.

With reference to FIG. 2, in an embodiment of the disclosure, a semiconductor wafer 20 includes a plurality of chips 22, a plurality of test pads 26, and a test control circuit 28. In an embodiment, through a wafer dicing process, the semiconductor wafer 20 is diced along dicing lanes 24, such that the chips 22 are separated from one another. The semiconductor wafer 20 may be made of silicon or other semiconductor materials. The chips 22 may include logic circuits, memory circuits, analog device circuits, other similar circuits, or combinations thereof, and the disclosure is not limited thereto. For instance, the chips 22 may be dynamic random access memory chips.

In some embodiments, the test pads 26 may be disposed in the dicing lane 24. A material of the test pads 26 is a metal material, such as aluminum, aluminum alloy, or a combination thereof. The test pads 26 may be interconnected with a metal circuit layer in the semiconductor wafer 20, such that the test pads 26 may be electrically connected to the devices in the chips 22. A test fixture (e.g., a probe on a probe card) of a test machine may contact the corresponding test pad 26 of the semiconductor wafer 20 to perform an electrical test on the chips 22. In other words, the test pads 26 may receive test signals provided by the test machine from the test fixture. In some embodiments, the test fixture does not exhibit a signal sharing function, but directly transmits a plurality of test signals independent of each other and generated by the test machine to the test pads 26, so that the test pads 26 may receive test signals with high signal integrity.

In this embodiment, the test control circuit 28 may be formed on the dicing lane 24 between the chips 22. Nevertheless, in other alternative embodiments, the test control circuit 28 may be formed in an internal portion of one of the chips 22. The test control circuit 28 may receive the test signals generated by the test machine through the test fixture and the test pads 26. The test control circuit 28 is configured to expand a specific test signal received by a specific test pad 26 to M broadcast test signals. As such, the M chips 22 may receive the corresponding broadcast test signals at the same time and chip testing may be performed in parallel, where M is an integer greater than 1.

Figure 3:
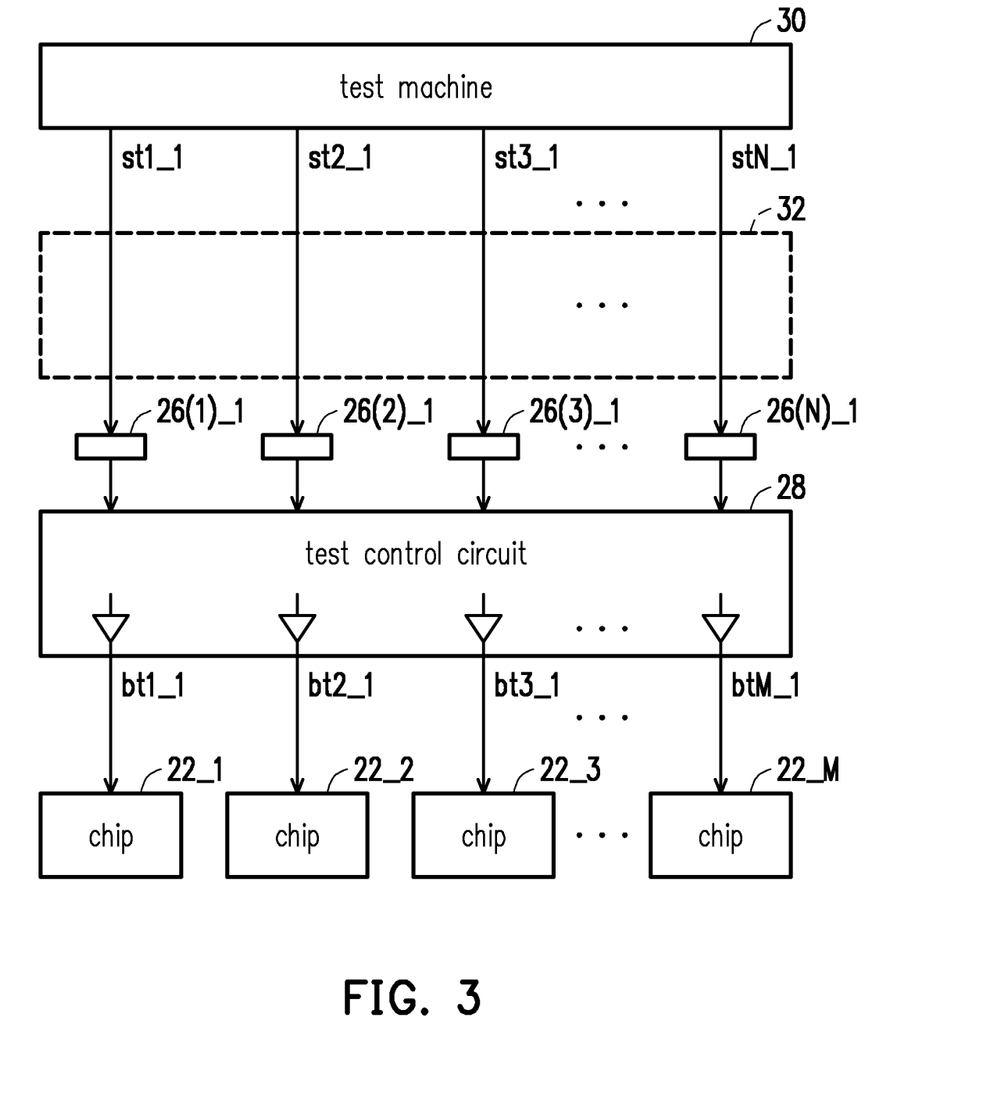
FIG. 3 is a schematic diagram of a chip testing system according to an embodiment of the disclosure.

With reference to FIG. 3, a chip testing system provided by an embodiment of the disclosure includes a test machine 30, a test fixture 32, and the semiconductor wafer 20. The test machine 30 generates N test signals st1_1 to stN_1, and the test fixture 32 transmits the test signals st1_1 to stN_1 to N test pads 26(1)_1 to 26(N)_1. To be specific, the test machine 30 may generate N test signals st_1_1 to stN_1 with a same signal waveform, where N is an integer greater than 1.

The test control circuit 28 is electrically connected to M chips 22_1 to 22_M and the N test pads 26(1)_1 to 26(N)_1. The test control circuit 28 may select at least one selected test signal (e.g., a test signal that is determined not to be interfered) from the test signals st1_1~stN_1, generates M broadcast test signals bt1_1 to btM_1 according to the selected test signal, and provides the broadcast test signals bt1_1 to btM_1 to the chips 22_1 to 22_M. To be specific, the test control circuit 28 may duplicate the selected test signal as M broadcast test signals bt1_1 to btM_1. For instance, the test control circuit 28 may generate M broadcast test signals bt1_1 to btM_1 through an internal unity gain buffer circuit thereof. Signal waveforms of the broadcast test signals bt1_1 to btM_1 are identical to each other, and the signal waveforms of the broadcast test signals bt1_1 to btM_1 are identical to that of the selected test signal.

As shown in FIG. 3, the chip 22_1 receives the broadcast test signal bt1_1, the chip 22_2 receives the broadcast test signal bt2_1, and the rest may be deduced by analogy. Accordingly, each of the chips 22_1 to 22_M may perform chip testing according to the corresponding one among the broadcast test signals bt1_1 to btM_1 and reports a test result back to the test machine 30. In some embodiments, the test control circuit 28 duplicates the selected test signal through a buffer circuit. As such, even if one of the chips 22_1 to 22_M couples the corresponding one among the broadcast test signals bt1_1 to btM_1 to a short-circuit path or a leakage current path, the test results of other chips are not affected.

Figure 4:
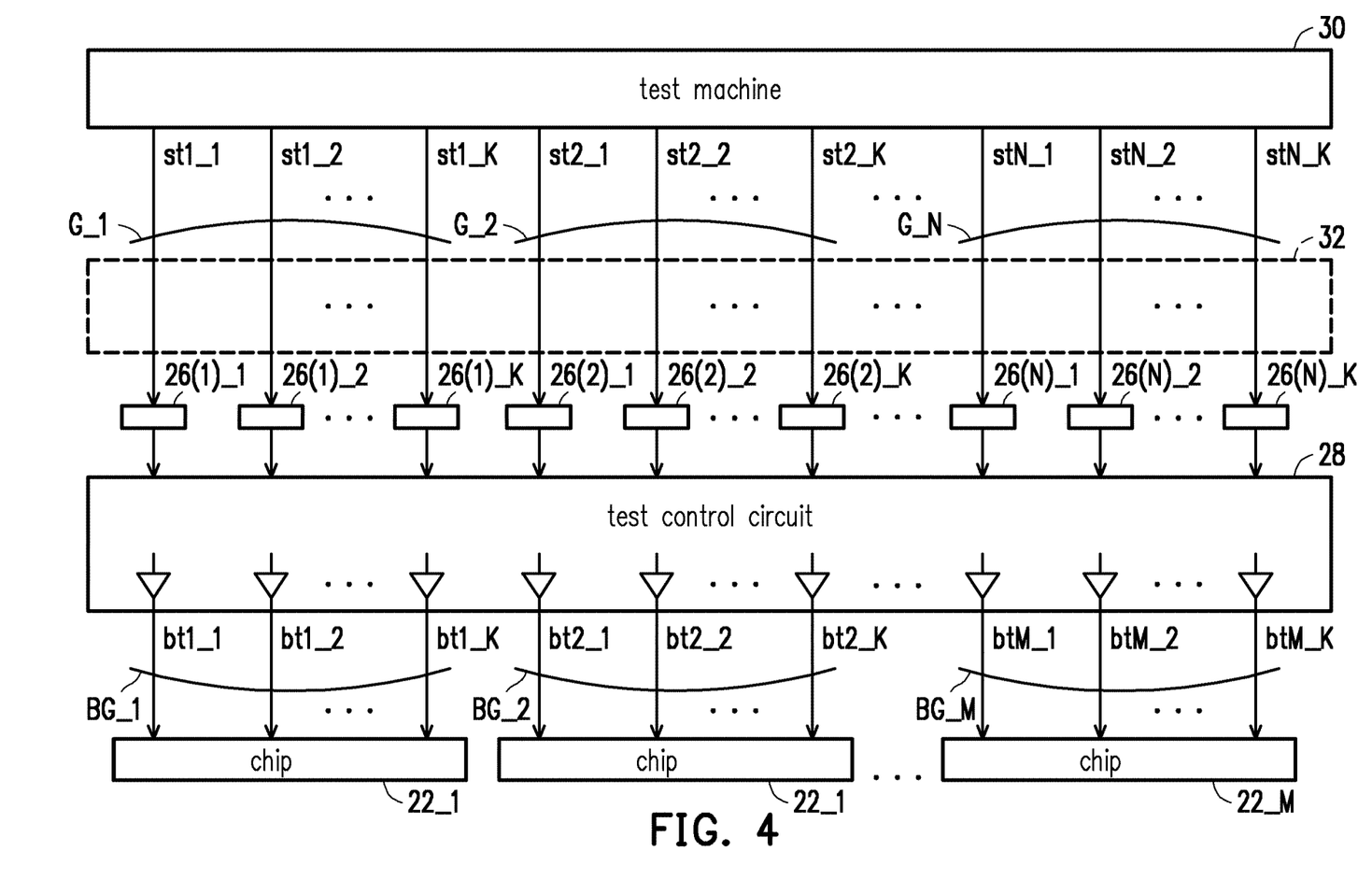
FIG. 4 is a schematic diagram of the chip testing system according to an embodiment of the disclosure.

With reference to FIG. 4, in an embodiment of the disclosure, the test machine 30 of the chip testing system may generate N test signal groups G_1 to G_N, and each of the test signal groups G_1 to G_N includes k test signals. That is, N×k test signals st1_1 to st1_k (i.e., a plurality of first test signals), st2_1 to st2_k (i.e., a plurality of second test signals), . . . , and stN_1 to stN_k are generated, where k is a positive integer. The test fixture 32 respectively transmits test signals st1_1 to st1_k, st2_1 to st2_k, . . . , and stN_1 to stN_k to N×k test pads 26(1)_1 to 26(1)_k (i.e., a plurality of first test pads), 26(2)_1 to 26(2)_k (i.e., a plurality of second test pads), . . . , and 26(N)_1 to 26(N)_k. For instance, the test pad 26(1)_1 may receive the test signal st1_1 from the test fixture 32. Each of the test signal groups G_1 to G_N is configured to perform a same test item. That is, the signal waveform of each of the test signals in each of the test signal groups G_1 to G_N may be identical to the signal waveform of the corresponding test signal of other test signal groups. For instance, the signal waveform of the test signal st1_1 is identical to the signal waveform of the test signal st2_1.

In this embodiment, the test control circuit 28 may select one of the N test signal groups G_1 to G_N, so as to further treat the test signals of the selected test signal group as a plurality of selected test signals. For instance, the test control circuit 28 may select the test signals st1_1 to st1_k as the selected test signals from the test signals st1_1 to st1_k belonging to the test signal group G_1 and the test signals st2_1 to st2_k belonging to the test signal group G_2. In this way, the test control circuit 28 may generate M×k broadcast test signals bt1_1 to bt1_k, bt2_1 to bt2_k, . . . , and btM_1 to btM_k according to the selected test signals st1_1 to st1_k and provides the broadcast test signals bt1_1 to bt1_k, bt2_1 to bt2_k, . . . , and btM_1 to btM_k to the chips 22_1 to 22_M. To be specific, the test control circuit 28 may generate M broadcast signal groups BG_1 to BG_M according to the selected test signal group (for example, G_1) and a signal duplication circuit, and each of the broadcast signal groups BG_1 to BG_M includes k broadcast test signals. For instance, the test control circuit 28 may duplicate the test signal st1_1 as M broadcast test signals bt1_1, bt2_1, . . . , and btM_1.

As shown in FIG. 4, the chip 22_1 receives the broadcast test signals bt1_1 to bt1_k of the broadcast signal group BG_1, the chip 22_2 receives the broadcast test signals bt2_1 to bt2_k of the broadcast signal group BG_2, and the rest may be deduced by analogy. Accordingly, each of the chips 22_1 to 22_M may perform chip testing according to the corresponding one among the broadcast signal groups BG_1 to BG_M and reports a test result back to the test machine 30. Note that in some embodiments, even if one of the chips 22_1 to 22_M couples the received broadcast test signal to the short-circuit path or the leakage current path, the test results of other chips are not affected. Moreover, in the case that at least one correct test signal group is available, regarding the test results of the chips 22_1 to 22_M, chip inspection may be performed according to the expected test signals. Further, based on the embodiments of FIG. 3 and FIG. 4, chip testing may be performed to the M chips 22_1 to 22_M on the semiconductor wafer in parallel to save testing time.

The following example is provided to illustrate the detailed implementation of generation of the selected test signal by the test control circuit 28, and the example is provided based on the architecture of FIG. 4 and k=4. Nevertheless, the disclosure should not be construed as limited thereto.

Figure 5:
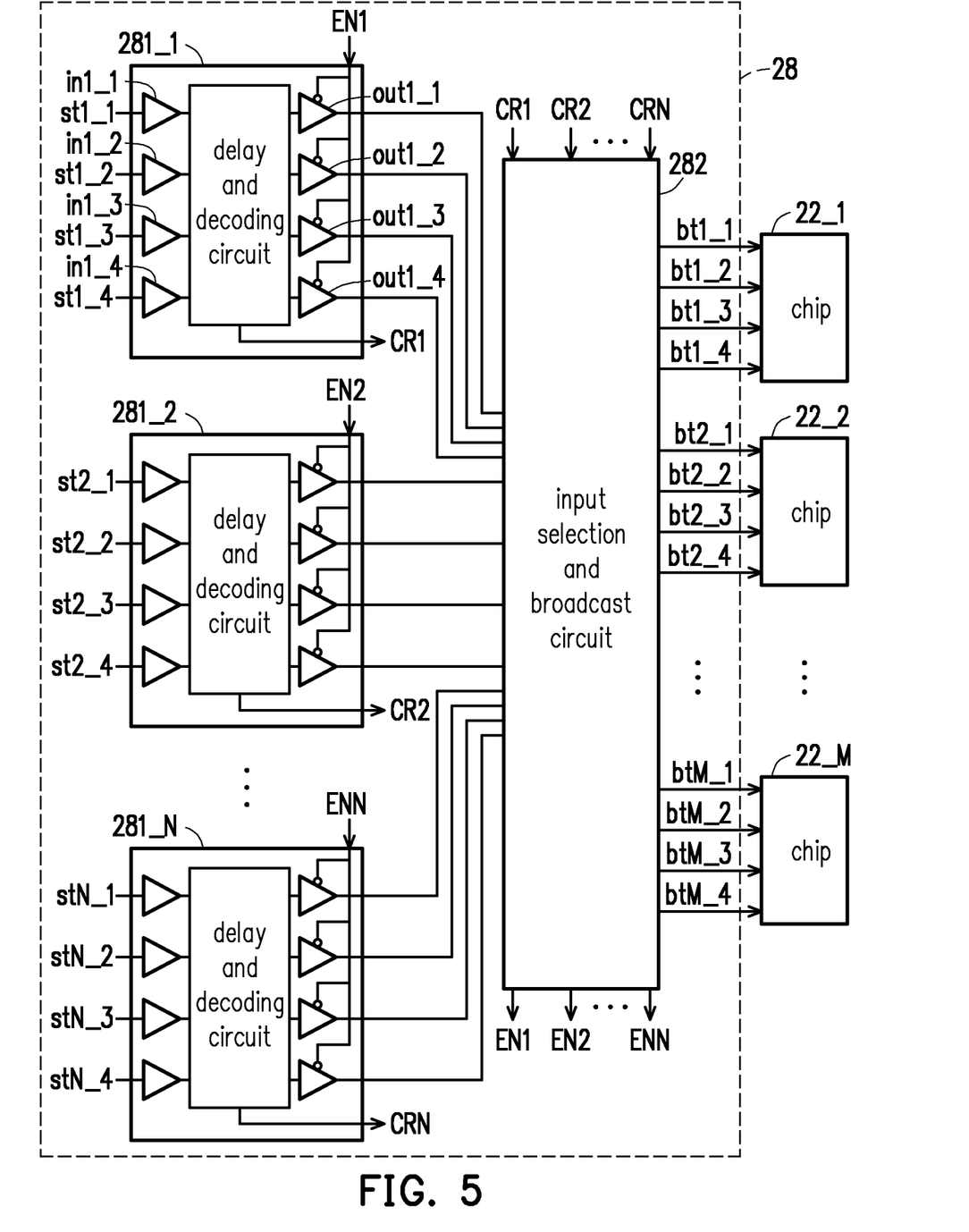
FIG. 5 is a schematic block view of a test control circuit according to an embodiment of the disclosure.

With reference to FIG. 5, in an embodiment of the disclosure, the test control circuit 28 may include N signal receiving and decoding circuits 281_1 to 281_N and an input selection and broadcast circuit 282. The signal receiving and decoding circuits 281_1 to 281_N are configured to receive N×4 test signals st1_1 to st1_4, st2_1 to st2_4, . . . , and stN_1 to stN_4 from the test pads 26(1)_1 to 26(1)_4, 26(2)_1 to 26(2)_4, . . . , and 26(N)_1 to 26(N)_4 and are configured to output the selected test signals and N channel confirmation signals CR1 to CRN. The input selection and broadcast circuit 282 is electrically connected to the signal receiving and decoding circuits 281_1 to 281_N and the chips 22_1 to 22_M, is configured to receive the selected test signals and the N channel confirmation signals CR1 to CRN, and respectively outputs the generated output enable signals EN1 to ENN and the broadcast test signals bt1_1 to bt1_4, bt2_1 to bt2_4, . . . , and btM_1 to btM_4 to the signal receiving and decoding circuits 281_1 to 281_N and the chips 22_1 to 22_M.

The input selection and broadcast circuit 282 generates 4 selected test signals from the N×4 test signals st1_1 to st1_4, st2_1 to st2_4, . . . , and stN_1 to stN_4 according to a level of each of the channel confirmation signals CR1 to CRN, generates the broadcast test signals bt1_1 to bt1_4, bt2_1 to bt2_4, . . . , and btM_1 to btM_4 according to these selected test signals, and provides the broadcast test signals bt1_1 to bt1_4, bt2_1 to bt2_4, . . . , and btM_1 to btM_4 to the chips 22_1 to 22_M in parallel. To be specific, the input selection and broadcast circuit 282 may select a plurality of selected test signals that are not interfered from the N test signal groups G_1 to G_N according to the levels of the channel confirmation signals CR1 to CRN, and determines output levels of the output enable signals EN1 to ENN according to selection results.

In some embodiments, the input selection and broadcast circuit 282 may determine the levels of the output enable signals EN1 to ENN according to the levels of the channel confirmation signals CR_1 to CRN with reference to the truth table shown in table 1, which should however not be construed as limitations to the disclosure.

TABLE 1

| Input (Channel Confirmation Signal) | | | | | Output (Output Enable Signal) | | | | |
|---|---|---|---|---|---|---|---|---|---|
| CR1 | CR2 | CR3 | ... | CRN | EN1 | EN2 | EN3 | ... | ENN |
| 1 | x | x | ... | x | 0 | 1 | 1 | ... | 1 |
| 0 | 1 | x | ... | x | 1 | 0 | 1 | ... | 1 |
| 0 | 0 | 1 | ... | x | 1 | 1 | 0 | ... | 1 |
| ... | ... | ... | ... | ... | ... | ... | ... | ... | ... |
| 0 | 0 | 0 | ... | 1 | 1 | 1 | 1 | ... | 0 |

Herein, "1" represents a high logic level, and "0" represents a low logic level. In the examples shown in Table 1, when the channel confirmation signal CR1 has a high logic level, the input selection and broadcast circuit 282 generates the output enable signal EN1 with a low logic level and the output enable signals EN2 to ENN with high logic levels regardless of whether the levels of the other channel confirmation signals CR2 to CRN are high or low logic levels. When the channel confirmation signal CR1 has a low logic level and the channel confirmation signal CR2 has a high logic level, the input selection and broadcast circuit 282 generates the output enable signal EN2 with a low logic level and the output enable signals EN1 and EN3 to ENN with high logic levels regardless of whether the levels of the other channel confirmation signals CR3 to CRN are high or low logic levels, and the rest may be deduced by analogy.

In this embodiment, the signal receiving and decoding circuits 281_1 to 281_N determine the levels of the channel confirmation signals CR1 to CRN according to whether the test signals st1_1 to st1_4, st2_1 to st2_4, . . . , and stN_1 to stN_4 conform to a predetermined waveform. For instance, the signal receiving and decoding circuit 281_1 is electrically connected to the test pads 26(1)_1 to 26(1)_4 and includes input circuits in1_1 to in1_4 to receive the corresponding test signals st1_1 to st1_4. The signal receiving and decoding circuit 281_1 determines the level of the channel confirmation signal CR1 according to whether each of the test signals st1_1 to st1_4 conforms to the corresponding predetermined waveform required by testing. For instance, the signal receiving and decoding circuit 281_1 may include the decoding circuit coupled to output of the input circuits in1_1 to in1_4, so as to determine whether the test signals st1_1 to st1_4 conform to the corresponding predetermined waveform required by testing to accordingly generate the channel confirmation signal CR1. When each of the test signals st1_1 to st1_4 conforms to the corresponding predetermined waveform required by testing, the signal receiving and decoding circuit 281_1 may determine that the level of channel confirmation signal CR1 is a high logic level. When one of the test signals st1_1 to st1_4 does not conform to the corresponding predetermined waveform, the signal receiving and decoding circuit 281_1 may determine that the level of the channel confirmation signal CR1 is a low logic level. Operation manners of the signal receiving and decoding circuits 281_1 to 281_N are similar to one another, and repeated description is thus not provided herein. It thus can be seen that the signal receiving and decoding circuits 281_1 to 281_N may determine whether one received test signal group is interfered and accordingly output the channel confirmation signals CR1 to CRN with the corresponding levels to the input selection and broadcast circuit 282.

In this embodiment, the input selection and broadcast circuit 282 may control one of the signal receiving and decoding circuits 281_1 to 281_N to be enabled by using the output enable signals EN1 to ENN to obtain one of the test signal groups G_1 to G_N (i.e., the selected test signals). For instance, the signal receiving and decoding circuit 281_1 may include a delay circuit and output control circuits out1_1 to out1_4. The delay circuit is disposed between the output control circuits out1_1 to out1_4 and the input circuits in1_1 to in1_4 and is configured to delay the test signals st1_1 to st1_4. The delay circuit and the decoding circuit may be coupled to the output of the input circuits in1_1 to in1_4 in parallel. The output control circuits out1_1 to out1_4 are disposed between the delay circuit and the input selection and broadcast circuit 282 and is enabled according to the output enable signal EN1 to output the delayed test signals st1_1 to st1_4 to be treated as the selected test signals.

In this embodiment, when the output enable signal EN1 has a high logic level, the output control circuit of the signal receiving and decoding circuit 281_1 is disabled, so that the test signals st1_1 to st1_4 may not be outputted. In contrast, when the output enable signal EN1 has a low logic level, the output control circuit of the signal receiving and decoding circuit 281_1 is enabled, so that the test signals st1_1 to st1_4 are outputted to the input selection and broadcast circuit 282. For instance, table 2 is a truth table showing an example of determination of blocking or outputting test signal made by the signal receiving and decoding circuit 281_1. The rest of the signal receiving and decoding circuits 281_2 to 281_N may output or block the received test signals according to the same principle, and repeated description is not provided herein.

TABLE 2

| Signal Input (Output Enable Signal EN1) | Signal Output | | | |
|---|---|---|---|---|
| 0 | st1_1 | st1_2 | st1_3 | st1_4 |
| 1 | HZ | HZ | HZ | HZ |

Herein, "HZ" stands for high impedance (i.e., open circuit state).

Figure 6:
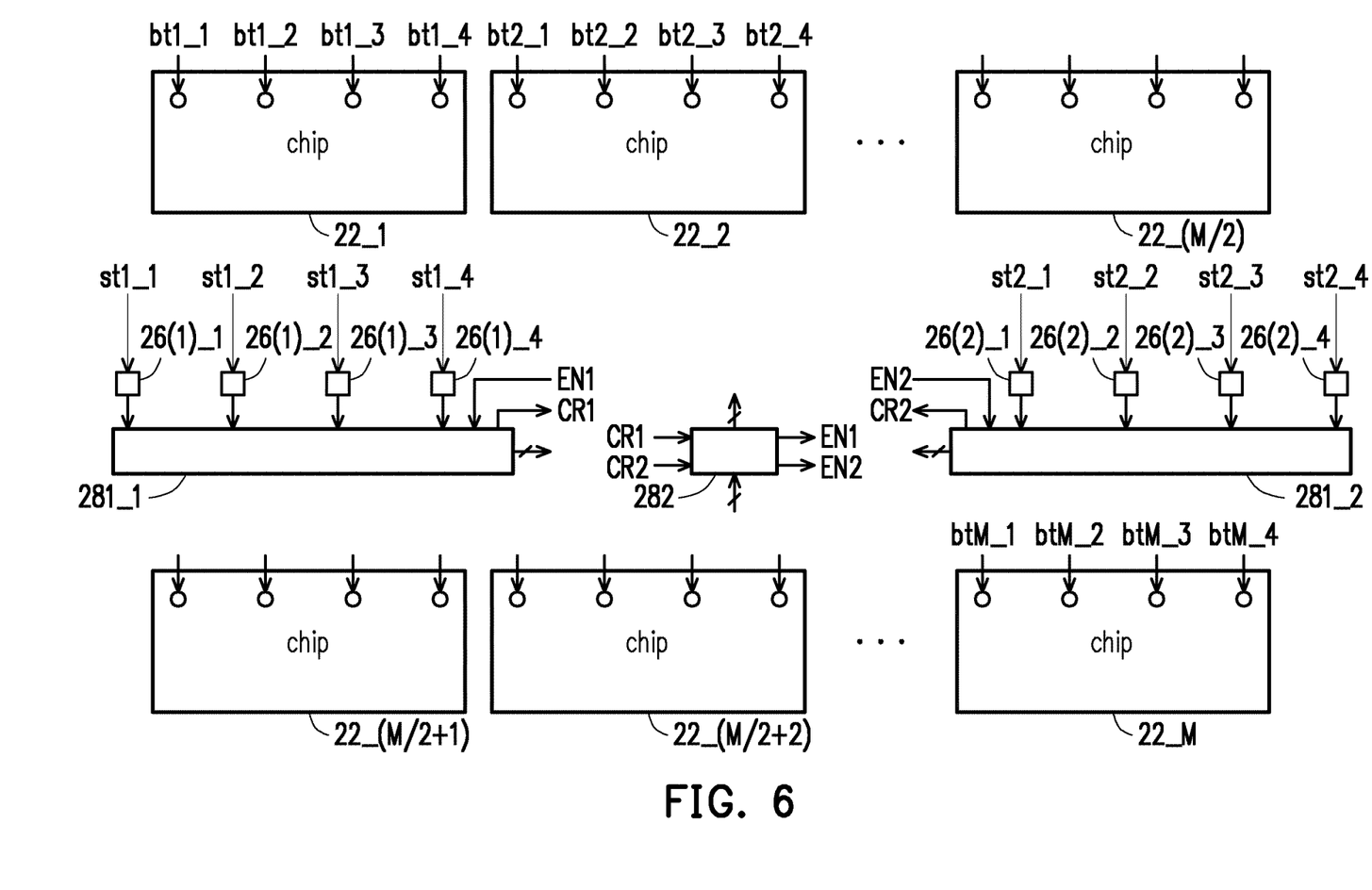
FIG. 6 is a schematic diagram of the test control circuit formed on a dicing lane according to an embodiment of the disclosure.

With reference to FIG. 6, assuming N=2, the signal receiving and decoding circuit 281_1 may receive the test signals st1_1 to st1_4 through the test pads 26(1)_1 to 26(1)_4, and the signal receiving and decoding circuit 281_2 may receive the test signals st2_1 to st2_4 through the test pads 26(2)_1 to 26(2)_4. In some embodiments, the signal receiving and decoding circuits 281_1 to 281_2 may be formed on a dicing lane between the chips 22_1 to 22_M. The signal receiving and decoding circuits 281_1 to 281_2 may respectively determine whether the test signals st1_1 to st1_4 and st2_1 to st2_4 conform to the predetermined waveform and accordingly output the channel confirmation signals CR1 to CR2 respectively. In some embodiments, the input selection and broadcast circuit 282 may be formed on the dicing lane between the chips 22_1 to 22_M. The chips 22_1 to 22_M are arranged on the semiconductor wafer in an array.

As shown in FIG. 6, the input selection and broadcast circuit 282 may receive the channel confirmation signals CR1 to CR2 from the signal receiving and decoding circuits 281_1 to 281_2 and accordingly determines the levels of the output enable signals EN1 to EN2. The input selection and broadcast circuit 282 respectively provides the output enable signals EN1 to EN2 to the signal receiving and decoding circuits 281_1 to 281_2, so that the signal receiving and decoding circuits 281_1 to 281_2 may determine whether to output the test signals st1_1 to st1_4 and st2_1 to st2_4 to the input selection and broadcast circuit 282. When receiving the test signals st1_1 to st1_4, the input selection and broadcast circuit 282 may duplicate the test signals st1_1 to st1_4 as the broadcast test signals bt1_1 to bt1_4, bt2_1 to bt2_4, . . . , and btM_1 to btM_4. The input selection and broadcast circuit 282 may provide the broadcast test signals bt1_1 to bt1_4, bt2_1 to bt2_4, . . . , and btM_1 to btM_4 to the corresponding chips 22_1 to 22_M through the metal circuit layer in the semiconductor wafer. For instance, the input selection and broadcast circuit 282 may provide the broadcast test signals bt1_1 to bt1_4 to the corresponding chips 22_1. In this way, when two groups of test signals st1_1 to st1_4 and st2_1 to st2_4 are provided by the test machine, the chips 22_1 to 22_M may obtain one of two groups of test signals st1_1 to st1_4 and st2_1 to st2_4 for chip testing in parallel.

Figure 7:
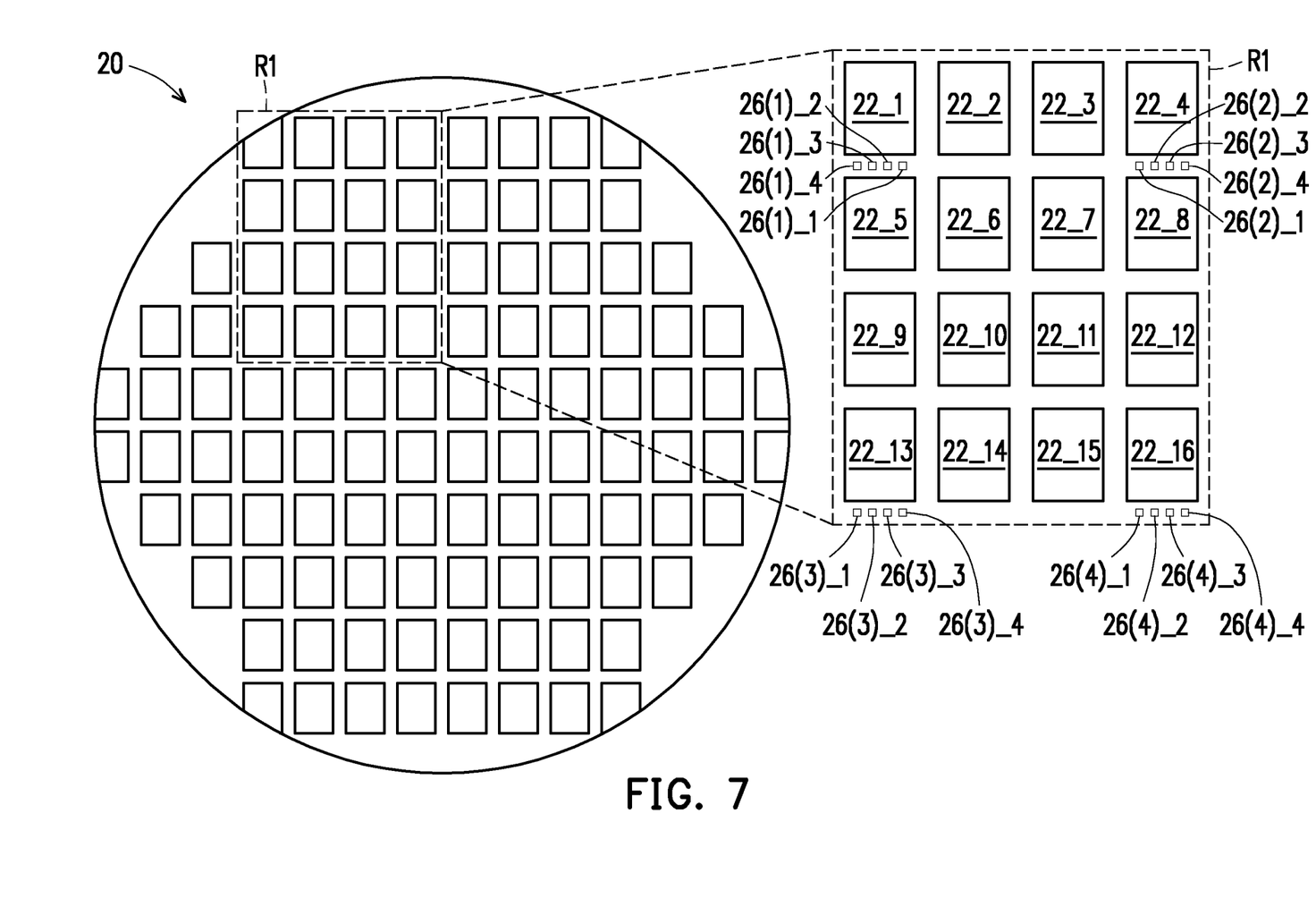
FIG. 7 is a schematic diagram of a chip testing region and a plurality of test pads according to an embodiment of the disclosure.

With reference to FIG. 7, in some embodiments, the semiconductor wafer 20 may be divided into a plurality of chip testing regions (e.g., a chip testing region R1). Each of the chip testing regions may include a plurality of chips. Division of the chip testing regions in the disclosure is not particularly limited and may be determined according to testing needs. The test machine may perform testing to the chip testing regions in sequence by using the test fixture, and the test machine may perform testing to the chips in each of the chip testing regions in parallel by using the test fixture. In some embodiments, the chips in the same chip testing region may receive the broadcast test signals which are generated based on the same one or multiple selected test signals from the corresponding test control circuit.

As shown in FIG. 7, the chip testing region R1 is used for illustration. It is assumed that the chip testing region R1 includes 16 chips 22_1 to 22_16, that is, M=16. Further, it is assumed that the test machine may produce 4 test signal groups, that is, N=4. In this case, 16 chips 22_1 to 22_16 and 4×4 test pads 26(1)_1 to 26(1)_4, 26(2)_1 to 26(2)_4, 26(3)_1 to 26(3)_4, and 26(4)_1 to 26(4)_4 may be formed in the chip testing region R1. The test control circuit (not shown in FIG. 7) in the chip testing region R1 may generate a plurality of broadcast test signals for the chips 22_1 to 22_16, so that the test machine may perform chip testing to 16 chips 22_1 to 22_16 at the same time. The test control circuit may be formed on the dicing lane in the chip testing region R1. Alternatively, the test control circuit may be formed in at least one of the chips 22_1 to 22_16 in the chip testing region R1.

In this embodiment, the test pads 26(1)_1 to 26(1)_4 configured to receive the test signals of a first test signal group may be disposed in the upper left corner region of the chip testing region R1. The test pads 26(2)_1 to 26(2)_4 configured to receive the test signals of a second test signal group may be disposed in the upper right corner region of the chip testing region R1. The test pads 26(3)_1 to 26(3)_4 configured to receive the test signals of a third test signal group may be disposed in the lower left corner region of the chip testing region R1. The test pads 26(4)_1 to 26(4)_4 configured to receive the test signals of a fourth test signal group may be disposed in the lower right corner region of the chip testing region R1. It thus can be seen that the multiple test pads corresponding to different test signal groups may be disposed at different corners of the chip testing region to ensure that the test control circuit on the semiconductor wafer may receive at least one test signal group that is not interfered. In this way, the situation in which the chip testing region receives only the bad test signal is prevented from occurring when an ugly die is included, the chip testing region is located at the edge of the wafer, or part of the process defective.

Figure 8:
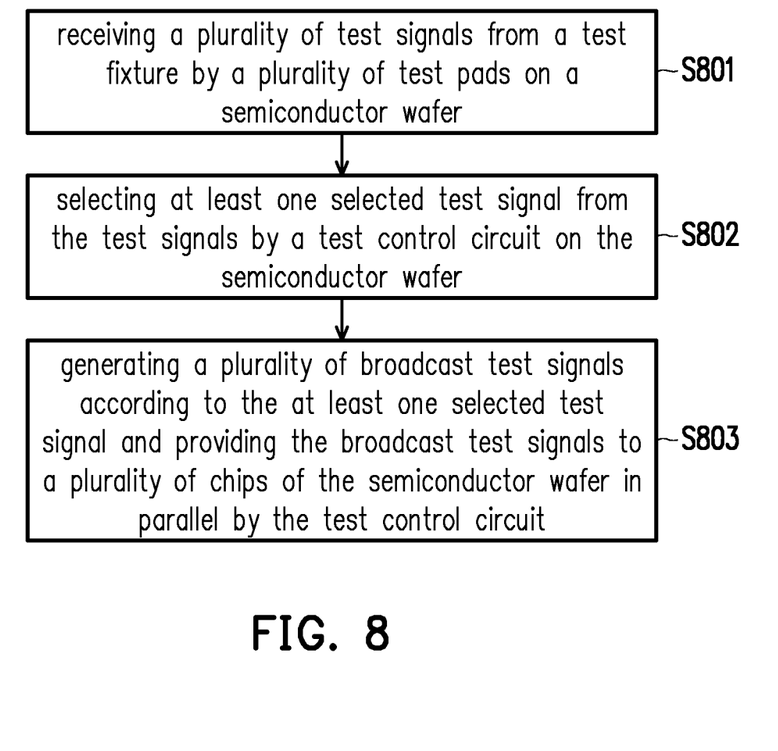
FIG. 8 is a flow chart of a chip testing method according to an embodiment of the disclosure.

With reference to FIG. 8, in a chip testing method provided by an embodiment of the disclosure, in step S801, a plurality of test signals independent of each other are received from a test fixture by a plurality of test pads. In step S802, at least one selected test signal is selected from the test signals by a test control circuit on a semiconductor wafer. In step S803, a plurality of broadcast test signals are generated according to the at least one selected test signal, and the broadcast test signals are provided to a plurality of chips of the semiconductor wafer in parallel by the test control circuit. Sufficient teachings and suggestions related to implementation details of the chip testing method of this embodiment may be acquired with reference to the description of the embodiments of FIG. 1 to FIG. 7, and that repeated description is not provided hereinafter.

In view of the foregoing, in the embodiments of the disclosure, the test signal groups generated by the test machine may be directly inputted to the test pads on the semiconductor wafer. The test control circuit on the semiconductor wafer may select reliable test signal group from the test signal groups and duplicates the selected test signal in the selected test signal group as multiple broadcast test signals. In this way, the chips may receive the corresponding broadcast test signals at the same time for chip testing. Therefore, each of the chips may receive the test signal with high signal integrity, and signal frequency drop may not occur in the test signal. Further, through arrangement of the test control circuit, the number of parallel tests may be increased, so the efficiency of chip testing is improved, and complexity and costs of the test fixture may also be reduced. In addition, the accuracy of chip testing may be improved, and the probability of overkilling may be reduced.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A semiconductor wafer, comprising:
    a plurality of chips;
    a plurality of test pads, receiving a plurality of test signals from a test machine via a test fixture, wherein the number of the plurality of test pads equals to the number of the plurality of test signals provided by the test machine; and
    a test control circuit, electrically connected between the chips and the test pads, selecting at least one selected test signal from the test signals, generating a plurality of broadcast test signals according to the at least one selected test signal, and providing the broadcast test signals to the chips in parallel, wherein the test control circuit is formed on the semiconductor wafer.

2. The semiconductor wafer according to claim 1, wherein the test pads comprise a plurality of first test pads and a plurality of second test pads, the test signals comprise a plurality of first test signals and a plurality of second test signals, the first test pads receive the first test signals, and the second test pads receive the second test signals,
    wherein the test control circuit selects the first test signals from the first test signals and the second test signals and generates the broadcast test signals according to the first test signals.

3. The semiconductor wafer according to claim 1, wherein the test pads receive test signals independent of each other from the test fixture, the semiconductor wafer comprises a plurality of chip testing regions, and the test pads are disposed at different corners of each of the chip testing regions.

4. The semiconductor wafer according to claim 1, wherein the test control circuit comprises an input selection and broadcast circuit electrically connected to the chips, and the input selection and broadcast circuit is configured to receive a plurality of channel confirmation signals, select the at least one selected test signal from the test signals according to a level of each of the channel confirmation signals, and generate the broadcast test signals according to the at least one selected test signal.

5. The semiconductor wafer according to claim 4, wherein the test control circuit comprises a plurality of signal receiving and decoding circuits electrically connected to the test pads, and the signal receiving and decoding circuits are configured to receive the test signals,
    determine the levels of the channel confirmation signals according to whether the test signals conform to a predetermined waveform, and correspondingly output the channel confirmation signals to the input selection and broadcast circuit.

6. The semiconductor wafer according to claim 5, wherein the input selection and broadcast circuit is configured to generate a plurality of output enable signals according to the levels of the channel confirmation signals and provide the output enable signals to the signal receiving and decoding circuits, and the signal receiving and decoding circuits output the at least one selected test signal to the input selection and broadcast circuit according to the output enable signals.

7. The semiconductor wafer according to claim 5, wherein each of the signal receiving and decoding circuits comprises:
    an input circuit, configured to receive at least one of the test signals,
    a decoding circuit, coupled to output of the input circuit, wherein the decoding circuit is configured to determine whether at least one of the test signals conforms to the predetermined waveform and generate one of the channel confirmation signals;
    a delay circuit, coupled to the output of the input circuit together with the decoding circuit in parallel, wherein the delay circuit is configured to delay at least one of the test signals; and
    an output control circuit, disposed between the delay circuit and the input selection and broadcast circuit, configured to be enabled according to an output enable signal to treat at least one delayed test signal as the at least one selected test signal to be outputted to the input selection and broadcast circuit.

8. The semiconductor wafer according to claim 7, wherein the output control circuit is enabled when the output control circuit receives the output enable signal at a low logic level, the output control circuit is disabled when the output control circuit receives the output enable signal at a high logic level to block output of the test signals received by the corresponding signal receiving and decoding circuits.

9. The semiconductor wafer according to claim 1, wherein the test control circuit is formed on a dicing lane between the chips.

10. The semiconductor wafer according to claim 1, wherein the test control circuit is formed in an internal portion of one of the chips.

11. The semiconductor wafer according to claim 1, wherein the test pads comprise a plurality of first test pads and a plurality of second test pads, the test signals comprise a plurality of first test signals and a plurality of second test signals, the first test pads receive the first test signals, and the second test pads receive the second test signals,     wherein the test control circuit selects the first test signals from the first test signals and the second test signals and generates the broadcast test signals according to the first test signals without using the second test signals received by the second test pads.

12. A multi-chip parallel testing method, comprising:

receiving a plurality of test signals from a test machine via a test fixture by a plurality of test pads on a semiconductor wafer, wherein the number of the plurality of test pads equals to the number of the plurality of test signals provided by the test machine;

selecting at least one selected test signal from the test signals by a test control circuit on the semiconductor wafer; and generating a plurality of broadcast test signals according to the at least one selected test signal and providing the broadcast test signals to a plurality of chips of the semiconductor wafer in parallel by the test control circuit, wherein the test control circuit on the semiconductor wafer is connected between the chips and the test pads.

13. The multi-chip parallel testing method according to claim 12, wherein the test pads comprise a plurality of first test pads and a plurality of second test pads, the test signals comprise a plurality of first test signals and a plurality of second test signals, the first test pads receive the first test signals, and the second test pads receive the second test signals,     wherein the step of selecting the at least one selected test signal from the test signals by the test control circuit comprises:

selecting the first test signals from the first test signals and the second test signals by the test control circuit,     wherein the test control circuit generates the broadcast test signals according to the at least one selected test signal, and the step of providing the broadcast test signals to the chips in parallel comprises:

generating the broadcast test signals according to the first test signals by the test control circuit.

14. The multi-chip parallel testing method according to claim 12, wherein the step of selecting the at least one selected test signal from the test signals by the test control circuit comprises:

receiving a plurality of channel confirmation signals by an input selection and broadcast circuit, and selecting the at least one selected test signal from the test signals according to a level of each of the channel confirmation signals.

15. The multi-chip parallel testing method according to claim 14, wherein the step of selecting the at least one selected test signal from the test signals by the test control circuit further comprises:

determining the levels of the channel confirmation signals according to whether the test signals conform to a predetermined waveform and correspondingly outputting the channel confirmation signals to the input selection and broadcast circuit by a plurality of signal receiving and decoding circuits.

16. The multi-chip parallel testing method according to claim 15, wherein the step of selecting the at least one selected test signal from the test signals by the test control circuit further comprises:

generating a plurality of output enable signals according to the levels of the channel confirmation signals and providing the output enable signals to the signal receiving and decoding circuits by the input selection and broadcast circuit; and outputting the at least one selected test signal to the input selection and broadcast circuit according to the output enable signals by the signal receiving and decoding circuits.

17. The multi-chip parallel testing method according to claim 16, wherein the step of determining the levels of the channel confirmation signals according to whether the test signals conform to the predetermined waveform and correspondingly outputting the channel confirmation signals to the input selection and broadcast circuit by the signal receiving and decoding circuits comprises:

receiving at least one of the test signals by an input circuit of each of the signal receiving and decoding circuits;

determining whether at least one of the test signals conforms to the predetermined waveform and generating one of the channel confirmation signals by a decoding circuit of each of the signal receiving and decoding circuits;

delaying at least one of the test signals by a delay circuit of each of the signal receiving and decoding circuits; and being enabled according to the output enable signal to treat the at least one delayed test signal as the at least one selected test signal to be outputted to the input selection and broadcast circuit by an output control circuit of each of the signal receiving and decoding circuits.

18. The multi-chip parallel testing method according to claim 17, wherein the output control circuit is enabled when the output control circuit receives the output enable signal at a low logic level, the output control circuit is disabled when the output control circuit receives the output enable signal at a high logic level to block output of the test signals received by the corresponding signal receiving and decoding circuits.

19. The multi-chip parallel testing method according to claim 13, wherein the test pads comprise a plurality of first test pads and a plurality of second test pads, the test signals comprise a plurality of first test signals and a plurality of second test signals, the first test pads receive the first test signals, and the second test pads receive the second test signals,     wherein the step of selecting the at least one selected test signal from the test signals by the test control circuit comprises:

selecting the first test signals from the first test signals and the second test signals by the test control circuit, wherein the test control circuit generates the broadcast test signals according to the at least one selected test signal, and the step of providing the broadcast test signals to the chips in parallel comprises:

generating the broadcast test signals according to the first test signals by the test control circuit without using the second test signals received by the second test pads.

\* \* \* \* \*